United States Patent [19]

Murai et al.

[11] Patent Number: 4,976,415
[45] Date of Patent: Dec. 11, 1990

[54] DAMPING SUPPORT STRUCTURE

[75] Inventors: Nobuyoshi Murai, Sakai; Yoshinori Takahashi, Tondabayashi; Kazuyoshi Katayama, Nishinomiya, all of Japan

[73] Assignee: Takenaka Corporation, A Japanese Corporation, Osaka, Japan

[21] Appl. No.: 360,238

[22] Filed: Jun. 1, 1989

[30] Foreign Application Priority Data

| Jun. 6, 1988 | [JP] | Japan | 63-140286 |
| Jun. 6, 1988 | [JP] | Japan | 63-140287 |
| Jun. 6, 1988 | [JP] | Japan | 63-140288 |
| Jun. 6, 1988 | [JP] | Japan | 63-140289 |

[51] Int. Cl.⁵ .............................. F16F 7/10
[52] U.S. Cl. .................... 267/136; 188/378; 248/550
[58] Field of Search .......... 188/378, 379, 380; 248/550; 267/136, 137; 73/664, 668, 663, 665, 666

[56] References Cited

U.S. PATENT DOCUMENTS

| 2,947,529 | 8/1960 | Schwartz et al. | |
| 3,889,936 | 6/1975 | Shimizu | |
| 4,033,541 | 7/1977 | Malueg | |
| 4,049,997 | 9/1977 | McGhee | 73/664 X |
| 4,436,188 | 3/1984 | Jones | 188/378 |
| 4,483,425 | 11/1984 | Newman | 188/378 |
| 4,633,982 | 1/1987 | Swigert | 188/379 X |
| 4,643,385 | 2/1987 | Sandercock | 248/550 |
| 4,730,541 | 3/1988 | Greene | 248/550 X |
| 4,795,123 | 1/1989 | Forward et al. | 188/378 X |
| 4,821,205 | 4/1989 | Schutten et al. | 248/550 X |
| 4,848,525 | 7/1989 | Jacot et al. | 248/550 X |
| 4,858,459 | 8/1989 | Takahashi | 188/380 X |

FOREIGN PATENT DOCUMENTS 195850 10/1986 European Pat. Off. .
2100831 7/1972 Fed. Rep. of Germany .

Primary Examiner—Douglas C. Butler
Attorney, Agent, or Firm—Oblon, Spivak, McClelland, Maier & Neustadt

[57] ABSTRACT

A damping support structure for preventing vibrations of an apparatus table supporting an apparatus for manufacturing ultra-high precision devices such as semiconductors and printed circuit boards. The apparatus table is supported by a support deck suspended to be horizontally displaceable. Linear motors are actuated in response to vibrations of the apparatus table detected by vibration sensors. The apparatus table is thus displaceable relative to a stationary section, to be safeguarded against the vibrations.

5 Claims, 10 Drawing Sheets (a)

(b)

(a)

(b)

(c)

(d)

DAMPING SUPPORT STRUCTURE

BACKGROUND OF THE INVENTION (1) Field of the Invention

The present invention relates to damping support structures for preventing vibrations of manufacturing apparatus. Such a support structure is installed in an LSI manufacturing plant, a laser appliance manufacturing plant or the like to support apparatus for manufacturing ultra-high precision devices such as semiconductors and printed circuit boards. The support structure absorbs vibrations due to earthquakes or microvibrations due to running vehicles through a floor or other base structure, thereby preventing vibrations of a table supporting the manufacturing apparatus.

(2) Description of the Prior Art

At the LSI manufacturing plant, laser appliance manufacturing plant and the like, it is necessary to suppress microvibrations since even microvibrations result in defective products. A conventional damping support structure includes spring elements such as laminated rubber layers and air springs arranged between a table on which a manufacturing apparatus is mounted and the floor or other base structure. These spring elements elastically support the apparatus table, and efficiently absorb microvibrations while mitigating shocks due to vibrations.

This conventional support structure, however, is incapable of eliminating the vibrations although it can mitigate the vibrations transmitted to the apparatus table.

There is another type of support structure which includes an auxiliary mass and a damper such as a hydraulic cylinder for preventing vibrations of the apparatus table. This structure has the disadvantage that the apparatus table becomes large and heavy with the inclusion of the auxiliary mass and damper. This structure must also has a sufficient strength for elastically supporting the auxiliary mass and damper.

Further, the damper has a damping force adjustable by the viscosity of oil, and the viscosity is too high for damping microvibrations. This impairs the vibration-proofing performance of the apparatus table.

SUMMARY OF THE INVENTION

An object of the present invention is to provide an improved damping support structure capable of effectively suppressing vibrations transmitted to the apparatus table without increasing the size of the latter.

Another object of the invention is to provide a simple support structure capable of absorbing three-dimensional displacements of the apparatus table.

A further object of the invention is to provide a support structure capable of smoothly moving the apparatus table relative to a stationary member.

A still further object of the invention is to provide a support structure capable of effectively suppressing vibrations in a manner to cope with the weight of an implement placed on the apparatus table.

In order to achieve these objects, the present invention provides a damping support structure having a stationary member, an apparatus table, and air springs disposed between the stationary member and the apparatus table for elastically supporting the apparatus table, the damping support structure comprising a support deck supported in suspension by the stationary member to be horizontally displaceable, the support deck supporting the apparatus table through the air springs arranged in a plurality of stages, linear motors operatively interconnecting the stationary member and the support deck, the linear motors being operable in three-dimensional directions including two horizontal directions perpendicular to each other and a vertical direction, vibration sensors connected to the apparatus table, and a control unit for deriving displacement and velocity signals from detection results received from the vibration sensors, and calculating control signals from the displacement and velocity signals for application to the linear motors.

According to the above construction, when the stationary member vibrates due to an earthquake or microvibrations, horizontal vibrations are transmitted to the suspended support deck with a delay from the vibrations of the stationary member. Vertical vibrations are successively mitigated through the air springs arranged in plural stages. The vibrations are ultimately transmitted in long cycles from the air springs to the apparatus deck. The vibration sensors detect the long cycle vibrations, whose detection results produce a displacement signal and a velocity signal from which control signals are derived. The linear motors are driven by the control signals, thereby to suppress the vibrations from being transmitted to the apparatus table.

This damping support structure is thus capable of damping vibrations transmitted to the apparatus table without providing an auxiliary mass for the apparatus table. Consequently, the apparatus table need not be increased in size or weight. The air springs need not have great strength, either. The support structure according to this invention, therefore, is inexpensive as a whole, and yet is capable of effectively damping the vibrations of the apparatus table.

Since the air springs are arranged in a plurality of stages, the vibrations are effectively mitigated, with microvibrations absorbed through the successive stages, thereby controlling the cycles of vibrations ultimately transmitted to the apparatus table. Long cycle vibrations not eliminated by this control are eliminated to have little rise by the action of the linear motors driving the apparatus table, thereby effectively suppressing the vibrations of the latter.

The linear motors are controllable by the control signals derived from the displacement and velocity signals which are based on detection results provided by the vibration sensors. Consequently, the apparatus table is maintained still at an absolute rest point, thereby realizing an excellent damping effect.

Other features and advantages of the present invention will be apparent from the following description.

DESCRIPTION OF THE PREFERRED EMBODIMENTS

Referring to FIGS. 1 through 4, a damping support structure comprises a base plate 1 fixed to a floor, suspenders 2 extending from the base plate 1, and a first air tank 3a suspended by the suspenders 2. The first air tank 3a acts as a first stage support deck which is horizontally displaceable.

Figure 1:
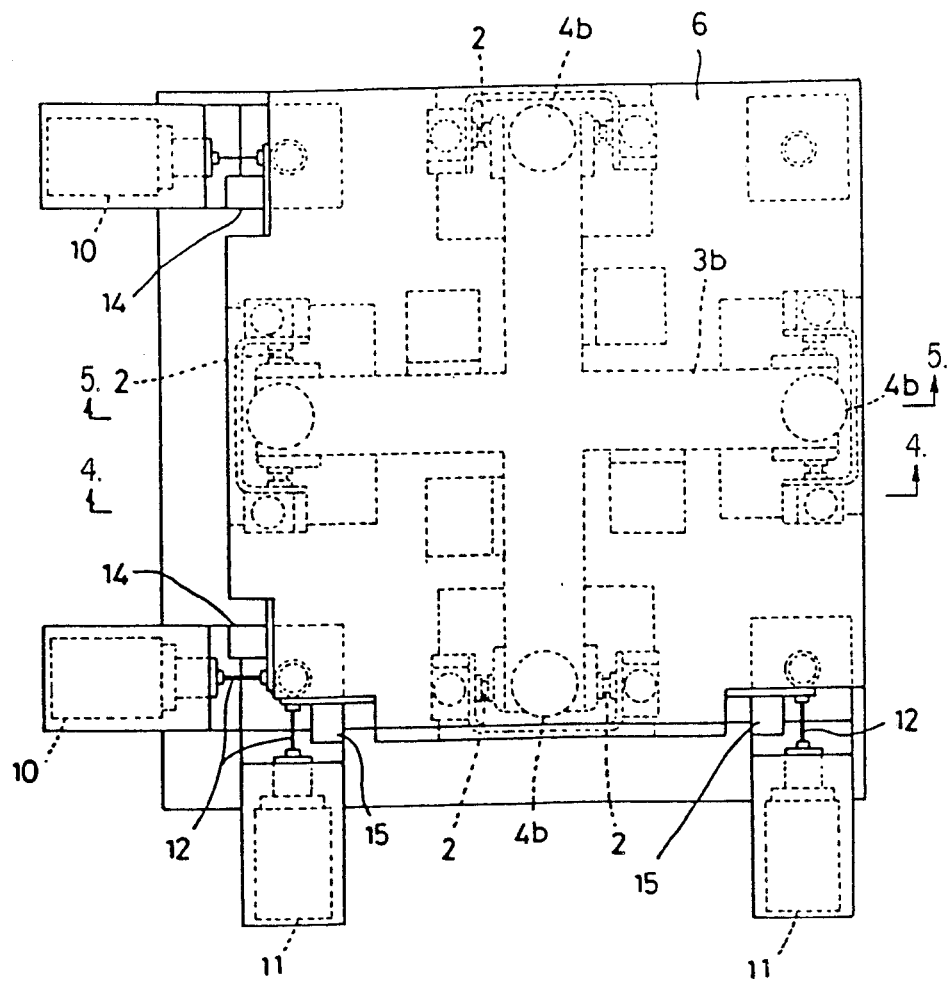
FIG. 1 is a plan view of an entire damping support structure according to the present invention.
Figure 2:
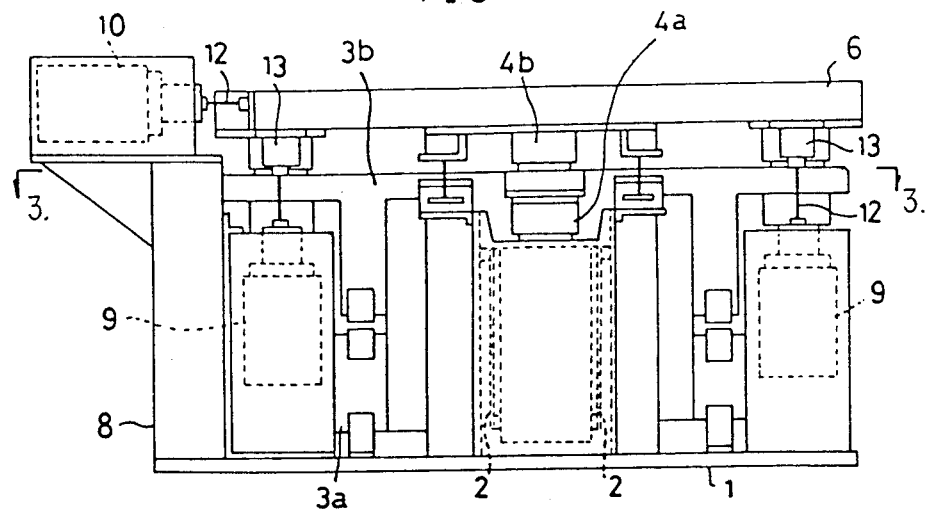
FIG. 2 is a side view of the support structure.
Figure 3:
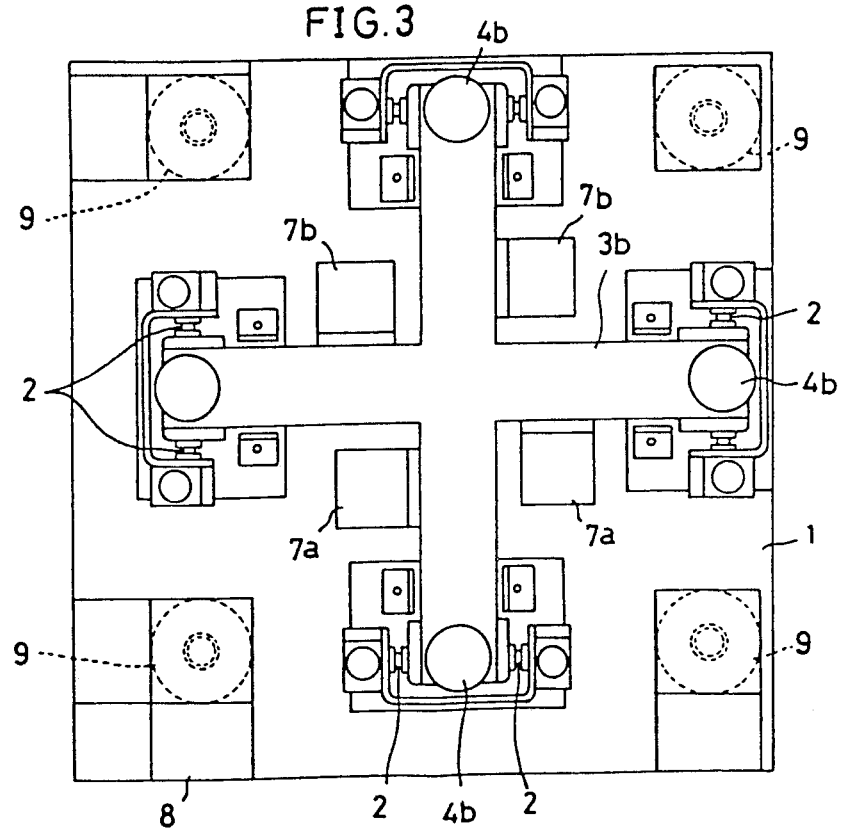
FIG. 3 is a section taken on line III—III of FIG. 2.
Figure 4:
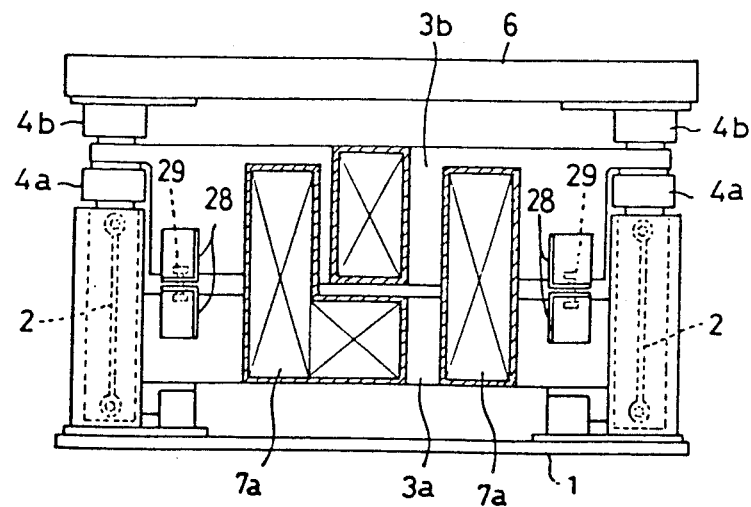
FIG. 4 is a section taken on line IV—IV of FIG. 1.
Figure 5:
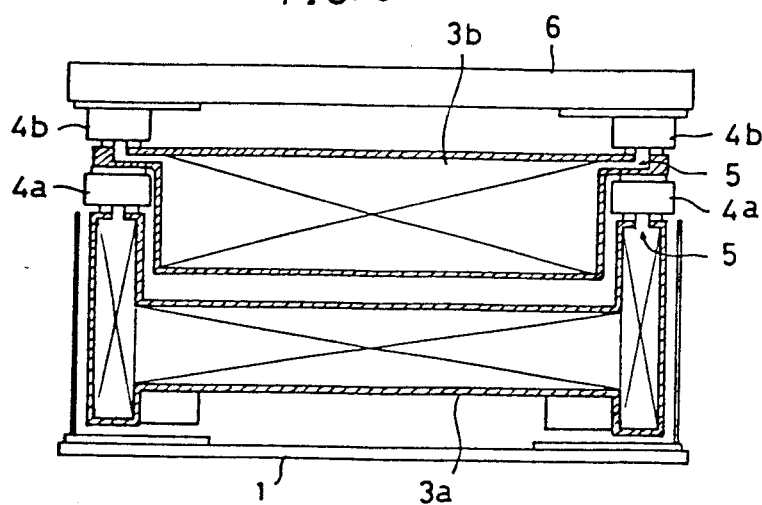
FIG. 5 is a section taken on line V—V of FIG. 1.

As shown in FIG. 5, first air springs 4a are disposed above the first air tank 3a. The first air tank 3a communicates with the first air springs 4a through orifices 5.

A second air tank 3b is supported on the first air springs 4a, which acts as a second stage deck. There are second air springs 4b disposed on the second air tank 3b. The second air tank 3b communicates with the second air spring 4b through orifices 5. An apparatus table 6 is supported on the second air springs 4b.

The first and second air tanks 3a and 3b are cross-shaped in plan view, respectively. Further, auxiliary air tanks 7a and 7b communicate with the first and second air tanks 3a and 3b, respectively.

Support columns 8 extend upward from the base plate 1, to which linear motors are secured for providing controls in a vertical direction. Certain of the support columns 8 each support a pair of linear motors 10 and 11 displaceable perpendicular to each other to provide controls in horizontal directions.

The apparatus table 6 has a rectangular shape in plan view. The apparatus table 6 is operatively connected at the four corners thereof to the linear motors 9, 10 and 11 through piano wires 12. When driven, the linear motors 9, 10 and 11 control vibrations of the apparatus table 6 in three-dimensional directions.

A vertical sensor 13 is mounted at the operative connection between each vertical control linear motor 9 and the apparatus table 6 for measuring vertical vibrations of the apparatus table 6. Horizontal sensors 14 and 15 are mounted adjacent the operative connections between the horizontal control linear motors 10 and 11 for measuring horizontal vibrations (in X and Y directions) of the apparatus table 6.

Figure 6:
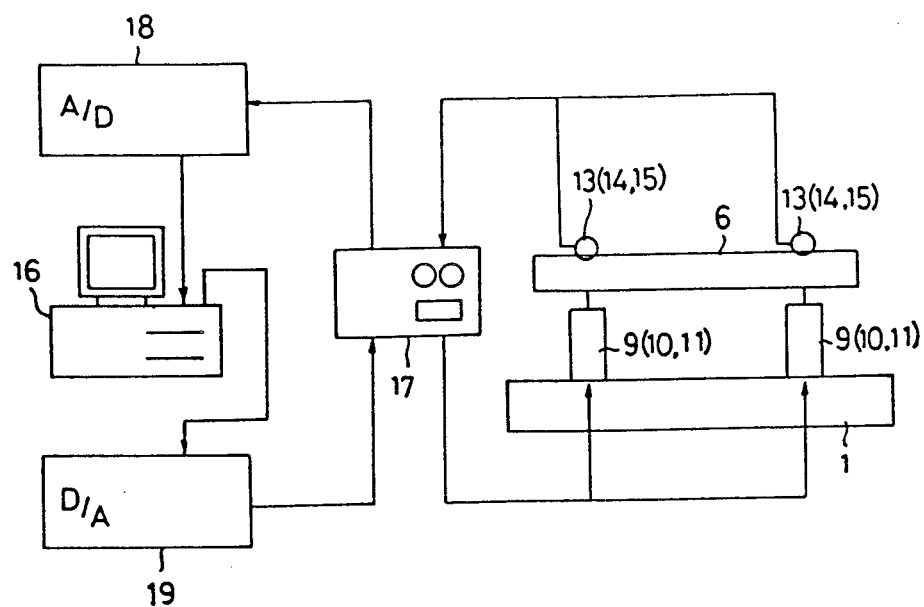
FIG. 6 is a system diagram of the support structure.

As shown in FIG. 6, measurements output from the vertical and horizontal sensors 13, 14 and 15 are transmitted to a computer 16 acting as a control unit, through an amplifier 17 and an analog-to-digital converter 18. The control unit 16 substitutes these measurements into relational expressions to carry out real-time processing of control signals for determining necessary amounts of movement of the respective linear motors 9, 10 and 11. These control signals are applied to the linear motors 9, 10 and 11 through a digital-to-analog converter 19 and the amplifier 17. The linear motors 9, 10 and 11 are thereby driven to reduce the measurements to zero and cancel the vibrations of apparatus table 6.

Upon receipt of the signals from the vertical and horizontal sensors 13, 14 and 15, the control unit 16 carries out real-time measurement of displacments ($X_1$, $X_2$, ... $X_8$) of eight linear motors 9, 10 and 11 from absolute rest points of the connections to the apparatus table 6. At the same time, the control unit 16 measures velocity signals ($X_1'$, $X_2'$, ... $X_8'$), substitutes constants ($a_{11}$, $a_{12}$, ..., $a_{78}$, $a_{88}$, $b_{11}$, $b_{12}$, ..., $b_{78}$, $b_{88}$) determined as gains according to vibration distributions at the respective connections, and calculates current strengths ($F_1$, $F_2$, ..., $F_8$), as set out hereunder, for output to the linear motors 9, 10 and 11. The linear motors 9, 10 and 11 are driven to suppress vibrations by feeding back the absolute displacement and absolute velocity.

$$F1 = a_{11}X_1 + a_{12}X_2 + a_{13}X_3 + a_{14}X_4 + a_{15}X_5 +$$
$$a_{16}X_6 + a_{17}X_7 + a_{18}X_8 + b_{11}X_1' + b_{12}X_2' + b_{13}X_3' +$$
$$b_{14}X_4' + b_{15}X_5' + b_{16}X_6' + b_{17}X_7' + b_{18}X_8'$$

$$F2 = a_{21}X_1 + a_{22}X_2 + \ldots + a_{28}X_8 + b_{21}X_1' + \ldots + b_{28}X_8'$$

$$F3 = a_{31}X_1 + a_{32}X_2 + \ldots + a_{38}X_8 + b_{31}X_1' + \ldots + b_{38}X_8'$$

$$F4 = a_{41}X_1 + a_{42}X_2 + \ldots + a_{48}X_8 + b_{41}X_1' + \ldots + b_{48}X_8'$$

$$F5 = a_{51}X_1 + a_{52}X_2 + \ldots + a_{58}X_8 + b_{51}X_1' + \ldots + b_{58}X_8'$$

$$F6 = a_{61}X_1 + a_{62}X_2 + \ldots + a_{68}X_8 + b_{61}X_1' + \ldots + b_{68}X_8'$$

$$F7 = a_{71}X_1 + a_{72}X_2 + \ldots + a_{78}X_8 + b_{71}X_1' + \ldots + b_{78}X_8'$$

$$F8 = a_{81}X_1 + a_{82}X_2 + \ldots + a_{88}X_8 + b_{81}X_1' + \ldots + b_{88}X_8'$$

Figure 7:
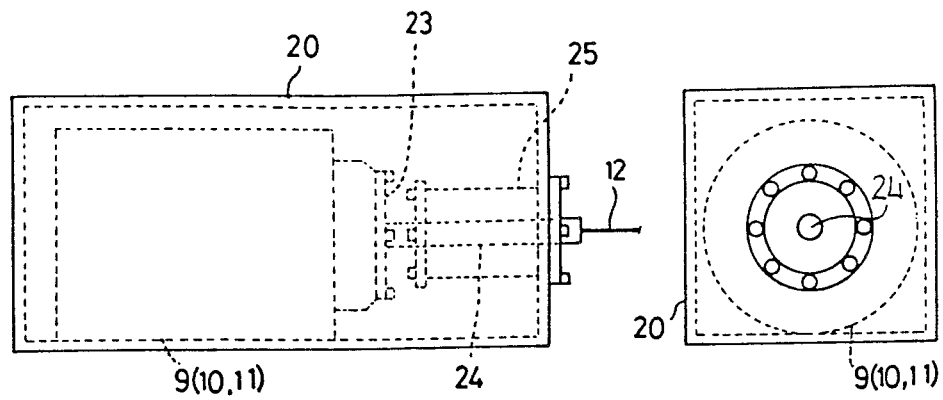
FIG. 7 is a front view of a linear motor.
Figure 8:
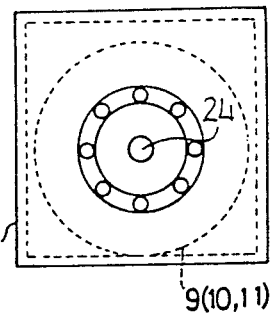
FIG. 8 is a side view of the linear motor.
Figure 9:
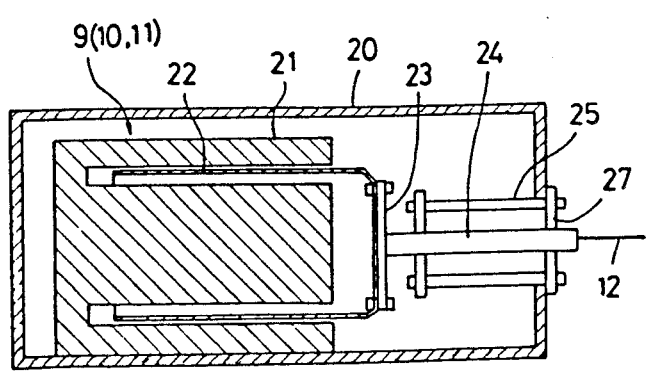
FIG. 9 is a front view, partly in section, of the linear motor.

As shown in FIGS. 7 through 9, each linear motor 9, 10 or 11 comprises a sealed case 20, a permanent magnet 21 mounted therein, and a movable member 23 carrying a voice coil 22 extending into the permanent magnet 21 to be movable relative thereto. The piano wire 12 is connected to a rod 24 continuous with the movable member 23. The control is applied in a selected amount and in a selected direction to the apparatus table 6 to control its vibrations by adjusting the amount and varying the direction of current flowing to the voice coil.

Thus, the apparatus table 6 is movable through the piano wires 12 in selected three-dimensional directions relative to the base plate 1. Compared, for example, with a combination of displacements of an X-stage and a Y-stage, this construction has the advantage of effectively absorbing a sudden movement occurring when, for example, an implement is placed on the apparatus table 6. Compared with the case of employing rod connections, this damping support structure employing the suspension and air springs 4a and 4b does not require unduly large springs, thereby checking deterioration of its damping performance, and does not increase the size and weight of the apparatus table 6. The air springs 4a and 4b, thus, need not have great strength either. Accordingly, this support structure may be small and inexpensive as a whole, and yet is capable of effectively damping vibrations.

Figure 10:
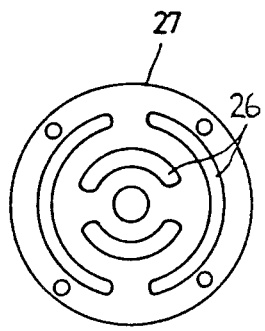
FIG. 10 is an enlarged front view of a plate spring.

The sealed case 20 includes a bearing frame 25 secured thereto. As shown in FIG. 10, the bearing frame 25 carries a plate spring 27 defining cutouts 26 to allow its elastic deformation in a direction of movement of the rod 24. The plate spring 27 and rod 24 are rigidly interconnected, whereby the rod 4 is smoothly displaceable without frictional resistance applied thereto.

Where, for example, ball bearings are interposed between the rod 24 and sealed case 20, a force exceeding a maximum statical friction, small as it may be, is required at an initial stage of rod displacement. After the rod 24 overcomes the maximum statical friction and begins moving, the friction changes into dynamic friction which causes a sudden displacement. As a result, the rod 24 makes a jerky displacement whereby the support structure will have difficulties in absorbing microvibrations. By contrast, the support structure according to the present invention, with the rods 24 of the linear motors 9, 10 and 11 displaceable as supported and guided by the plate springs 27, allows the rods 24 to move smoothly without any frictional resistance. Consequently, the apparatus table 6 is smoothly displaceable to absorb microvibrations with increased reliability.

The first and second air tanks 3a and 3b have brackets 28 extending from positions thereof opposed to each other. Bolts 29 are attachable to the opposed brackets 28. When the first and second air tanks 3a and 3b are rigidly interconnected by the bolts 29, the first air springs 4a are removed from the elastic supporting action, and only the second air springs 4b are used to elastically support the weight of the apparatus table 6 and various apparatus placed thereon. This construction acts as a switchable locking mechanism.

According to the present invention, measurement may be made of signals ($X_1''$, $X_2''$, ... $X_8''$) showing acceleration of the eight linear motors 9, 10 and 11 from the absolute rest points of the connections to the apparatus table 6. In this case, constants ($c_{11}$, $c_{12}$, ..., $c_{78}$, $c_{88}$) determined as gains according to vibration distributions at the respective connections are substituted into the acceleration signals ($X_1''$, $X_2''$, ... $X_8''$), and current strengths ($F_1$, $F_2$, ..., $F_8$) are calculated as set out hereunder, for output to the linear motors 9, 10 and 11.

$$F1 = a_{11}X_1 + a_{12}X_2 + a_{13}X_3 + a_{14}X_4 + a_{15}X_5 + a_{16}X_6 +$$
$$a_{17}X_7 + a_{18}X_8 + b_{11}X_1' + b_{12}X_2' + b_{13}X_3' + b_{14}X_4' +$$
$$b_{15}X_5' + b_{16}X_6' + b_{17}X_7' + b_{18}X_8' + c_{11}X_1'' +$$
$$c_{12}X_2'' + c_{13}X_3'' + c_{14}X_4'' + c_{15}X_5'' + c_{16}X_6'' +$$
$$c_{17}X_7'' + c_{18}X_8''$$

F2 to F8 are calculated similarly for controlling the linear motors 9, 10 and 11. Thus, high frequency components of the vibrations may be effectively suppressed by feeding back the absolute acceleration besides the absolute displacement and absolute velocity.

Results of comparative experiments will be described next.

Figure 11:
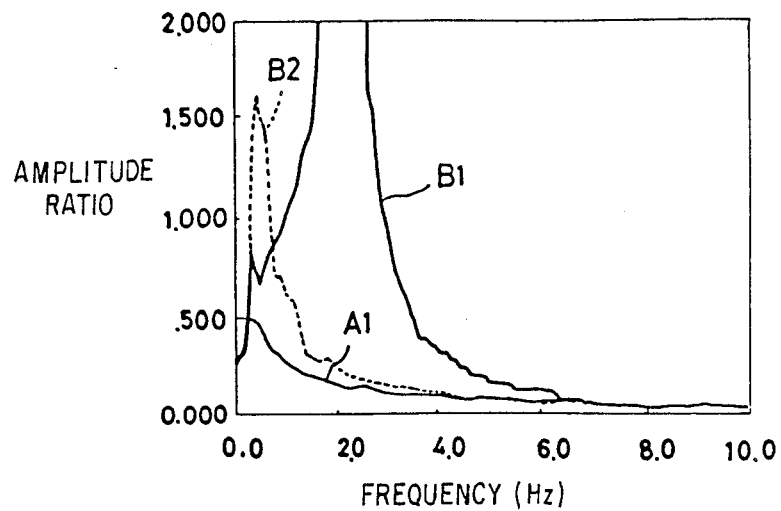
FIGS. 11(a) and 11(b) are graphs showing damping effects produced by the support structure according to the invention.
Figure 11:
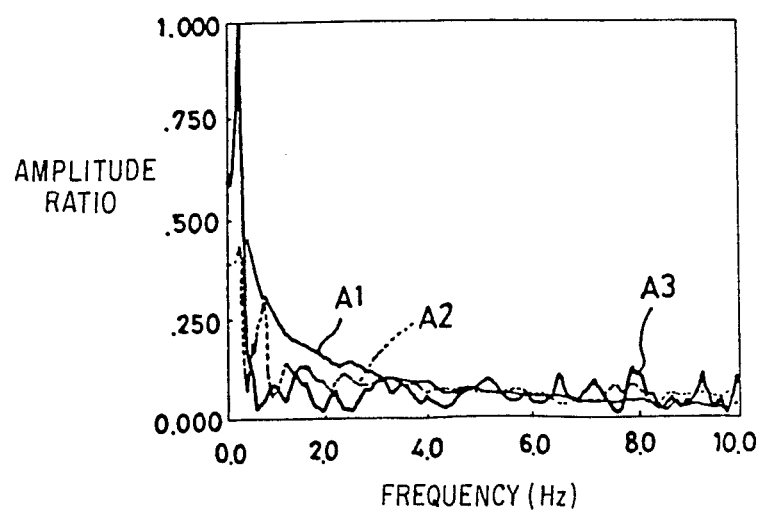

FIG. 11(a) is a graph showing a damping effect produced by the control based on the feedback of the absolute displacement and absolute velocity according the foregoing embodiment. The horizontal axis represents frequencies, and the vertical axis amplitude ratios (vibrations of the apparatus table 6/ vibrations of the base plate 1). The results are indicated in a thin solid line A1. The graph also includes results obtained from non-control (thick solid line B1) and from the feedback of only the absolute velocity (dotted line B2) for comparison purposes.

FIG. 11(b) is a graph showing a damping effect produced by varying the gains of the absolute displacement feedback in the foregoing embodiment, with the gains of the absolute velocity feedback maintained constant. In this graph, the dotted line A2 indicates a case where the gains are doubled, and the thick solid line A3 indicates a case where the gain are doubled again, i.e. made fourhold.

Figure 12:
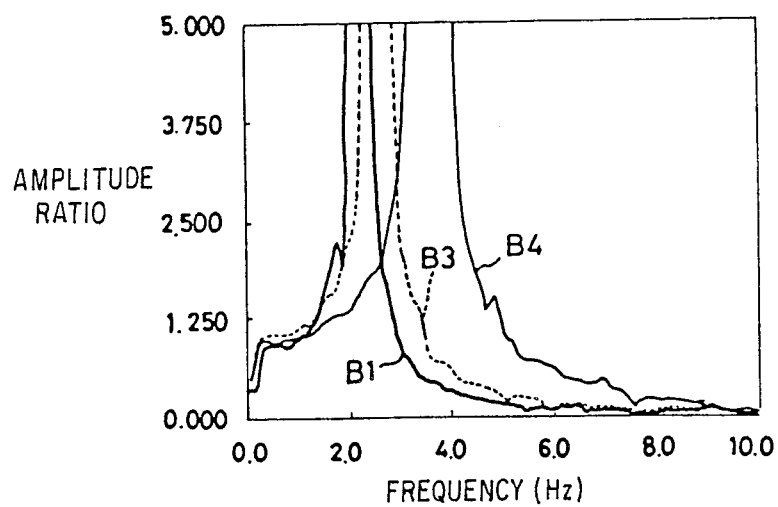
FIG. 12(a), 12(b), 12(c) and 12(d) are graphs showing damping effects produced by a comparitive example.
Figure 12:
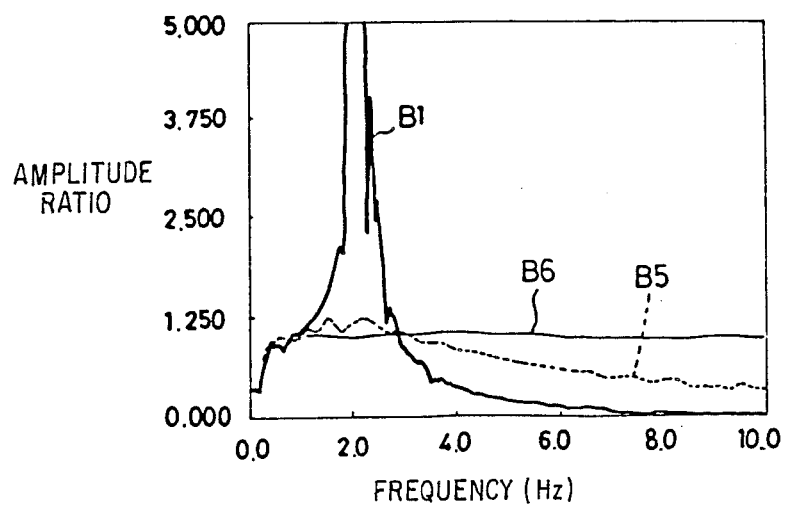
Figure 12:
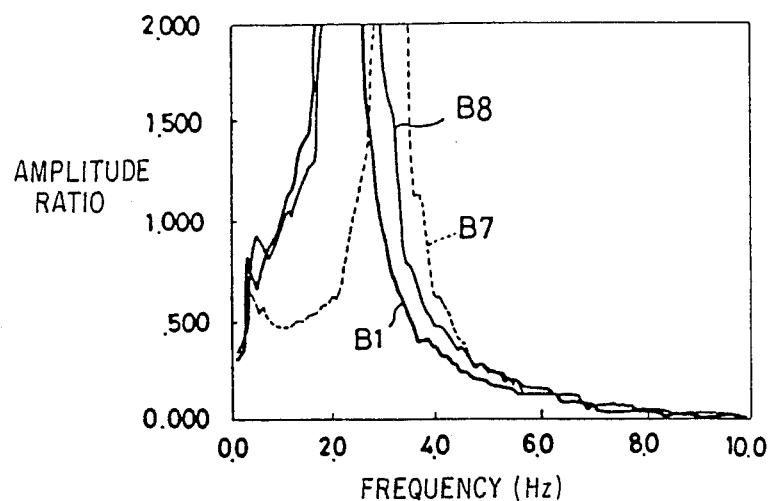
Figure 12:
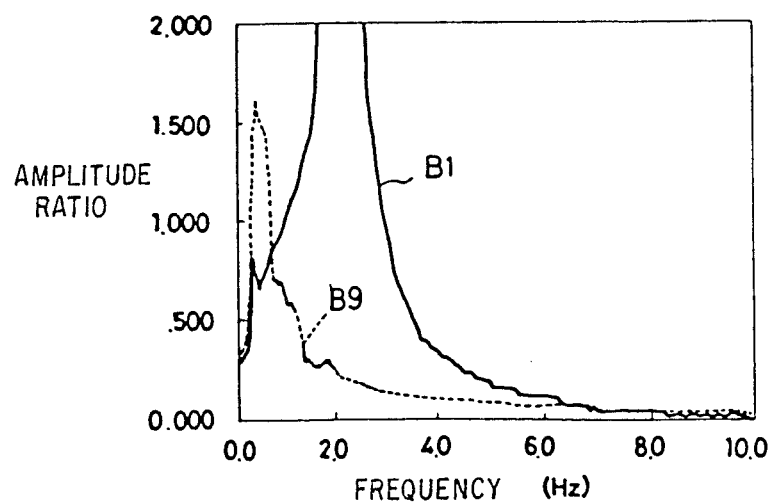

FIG. 12(a) is a graph showing results obtained from a comparative example in which only the relative displacement between the apparatus table 6 and base plate 1 is fed back, thereby to produce a spring effect. The results are indicated in a dotted line B3. The thick solid line B1 indicates the non-control, and the thin solid line B4 indicates the case of increasing the gains of the relative displacement feedback fourhold.

FIG. 12(b) is a graph showing a case of feeding back only the relative velocity between the apparatus table 6 and base plate 1, thereby to produce a damper effect. The results are indicated in a dotted line B5. The thick solid line B1 indicates the non-control, and the thin solid line B6 indicates the case of increasing the gains of the relative velocity feedback fourhold.

FIGS. 12(c) and 12(d) are graphs showing a case of feeding back only the absolute displacement, absolute acceleration or absolute velocity between the apparatus table 6 and base plate 1. The dotted line B7 indicates the case of feeding back only the absolute displacement, the thin solid line B8 indicates the case of feeding back only the absolute acceleration, the dotted line B9 indicates the case of feeding back only the absolute velocity, and the thick solid line B1 indicates the non-control.

The foregoing results prove the following facts:

Where the apparatus table 6 is elastically supported only with a spring effect, the frequency of resonance is increased but the amplitude cannot be suppressed (see FIG. 12(a)).

Even if the resonance is suppressed by the mechanical damper effect, the vibrations cannot be damped sufficiently though the amplitude is reduced. If the damper effect is increased, the amplitude of resonance will be reduced but will become rigid, thereby vibrating the apparatus table 6 with the base plate 1 (see FIG.12(b)).

The vibrations cannot be damped with a significant effect where the control is provided by feeding back only the absolute displacement or the absolute acceleration (see FIG. 12(c)). Where the vibration control is provided by feeding back only the absolute velocity, the resulting damper effect reduces the frequency and amplitude, but is not sufficient for damping the vibrations (FIG. 12(d)).

By contrast, where the control is provided by feeding back the absolute displacement and absolute velocity based on the control signals processed from the displacement and velocity signals, the vibrations transmitted the apparatus table 6 are instantly damped at the beginning, and very subtle vibrations can be controlled in an optimal way (FIG. 11(a)).

Where the gains of the absolute displacement feedback are increased, the damping effect may be improved in relation to low frequency components (FIG. 11(b)).

Another embodiment will be described next.

Figure 13:
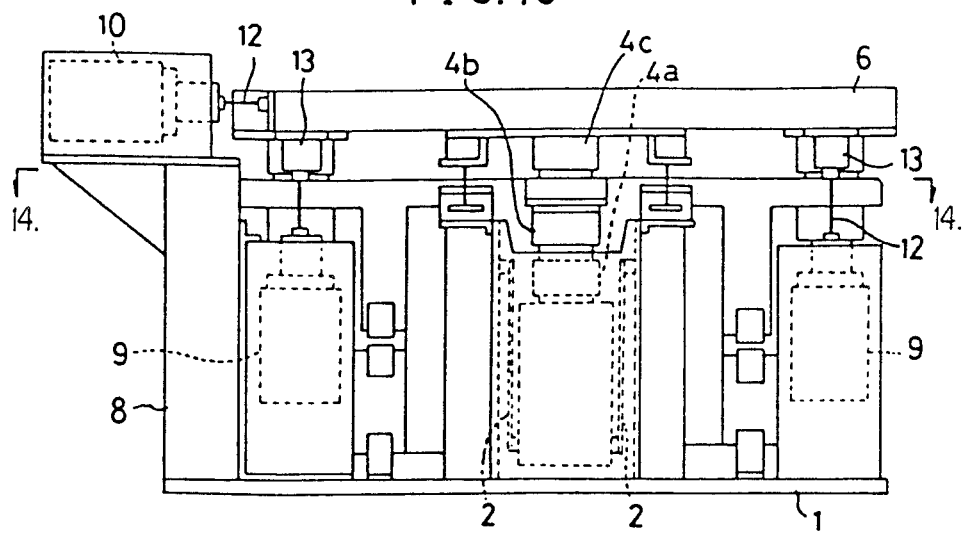
FIG. 13 is a side view of another embodiment of the present invention.
Figure 14:
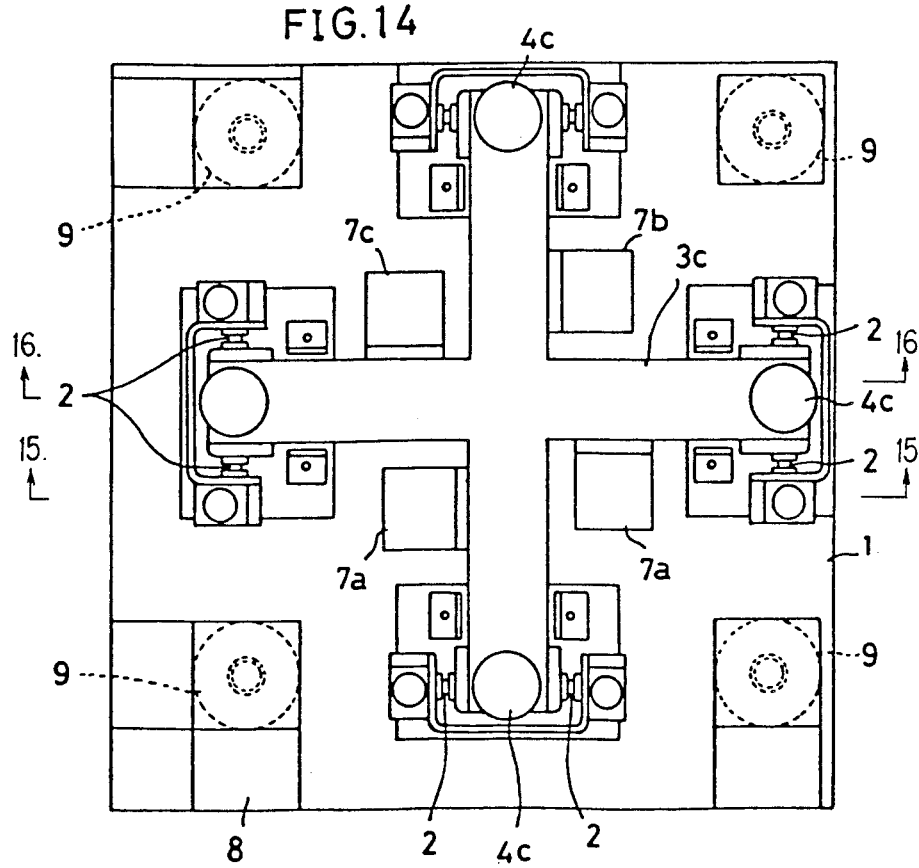
FIG. 14 is a section taken on line XIV—XIV of FIG. 13.
Figure 15:
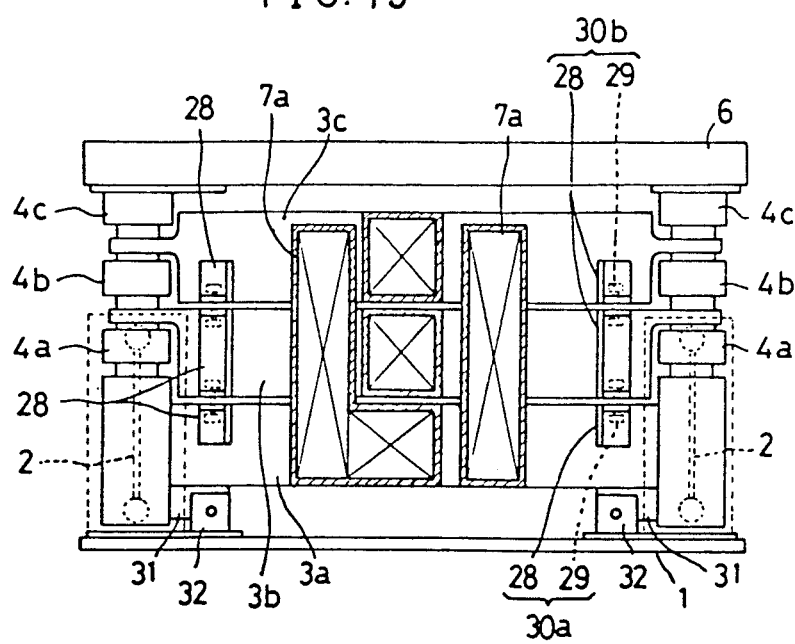
FIG. 15 is a section taken on line XV—XV of FIG. 14.
Figure 16:
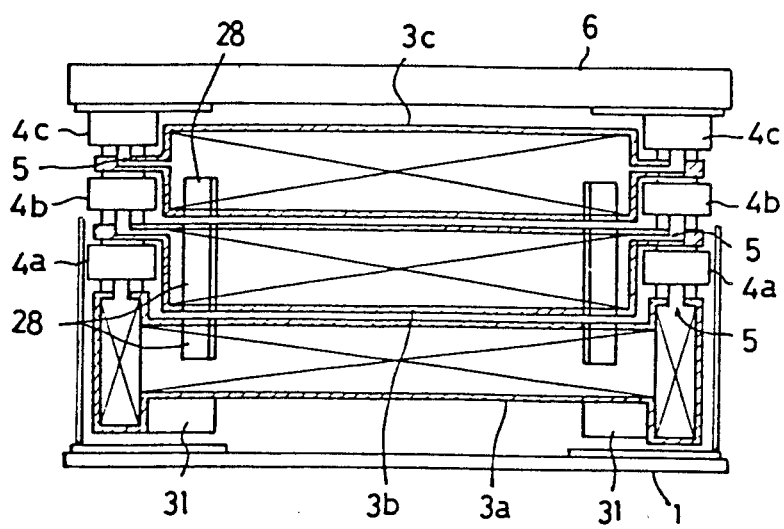
FIG. 16 is a section taken on line XVI—XVI of FIG. 14.

As shown in FIGS. 13 through 15, a damping support structure comprises a base plate 1 fixed to a floor, suspenders 2 extending from the base plate 1, and a first air tank 3a suspended by the suspenders 2. The first air tank 3a acts as a first stage support deck which is horizontally displaceable. As shown in FIG. 16, first air springs 4a are disposed above the first air tank 3a, a second air tank 3b disposed thereabove, then second air springs 4b, a third air tank 3c, third air springs 4c, and an apparatus table 6 on top.

The first air tank 3a communicates with the first air springs 4a, the second air tank 3b with the second air springs 4b, and the third air tank 3c with the third air springs 4c, respectively through orifices 5.

The first, second and third air tanks 3a, 3b and 3c are cross-shaped in plan view, respectively. Further, auxiliary air tanks 7a, 7b and 7c communicate with the three air tanks 3a, 3b and 3c, respectively.

The first air tank 3a has locking brackets 28 extending from upper positions thereof, while the second air tank 3b has locking brackets 28 extending from lower positions thereof to be opposed to the brackets 28 of the first air tank 3a. Bolts 29 are attachable to the opposed brackets 28. When the first and second air tanks 3a and 3b are rigidly interconnected by the bolts 29, the first air springs 4a are switched to an inoperable state. This construction acts as a first locking mechanism 30a.

The locking brackets 28 of the second air tank 3b extend upwardly to be opposed to locking brackets 28 extending from lower positions of the third air tank 3c. These opposed brackets 28 are lockable together by bolts 29 to switch the second air springs 4b inoperable. This construction acts as a second locking mechanism 30b.

When one or both of the first and second locking mechanisms 30a and 30b is/are placed in operation, either the first air springs 4a or the second air springs 4b or both are removed from the elastic supporting action. Then switching is made from a state in which the first to third air springs 4a, 4b and 4c provide the elastic support, to a state in which the second and third air springs 4b and 4c, the first and third air springs 4a and 4c, or only the third air springs 4c are used to elastically support the weight of the apparatus table 6 and various apparatus placed thereon.

The first air tank 3a further includes locking brackets 31 extending from lower positions thereof. On the other hand, locking brackets 32 extend from the base plate 1 to be opposed to the brackets 31. These brackets 31 and 32 may be bolted together, thereby locking the first air tank 3a to the base plate 1. At this time, the horizontal vibrations are damped only by the first to third air springs 4a, 4b and 4c.

As an alternative to the foregoing locking mechanisms 30a and 30b or to one of them, the apparatus table 6 and the third air tank 3c may include locking brackets 28 at opposed positions thereof, these locking brackets 28 being lockable together by bolts or other locking devices.

According to this embodiment, as described above, the number of air springs in action is variable by operating the locking mechanisms 30a and 30b to switch certain of the first to third air springs 4a, 4b and 4c between the operable state and inoperable state, for adjusting the rigid and characteristic vibration frequencies occurring in horizontal and vertical directions. This support structure is capable of damping the vibrations with increased reliability by applying proper rigid and characteristic frequencies in accordance with the weight of an implement placed on the apparatus table 6 and weight variations resulting from addition of attachments.

The damping support structure according to the present invention may include air springs arranged in four or more stages.

What is claimed is:

1. A damping support structure having a stationary member, an apparatus table, and air springs disposed between the stationary member and the apparatus table for elastically supporting the apparatus table, said damping support structure comprising;
   a support deck supported in suspension by said stationary member to be horizontally displaceable, said support deck supporting said apparatus table through said air springs arranged in a plurality of stages,
   linear motors operatively interconnecting said stationary member and said support deck, said linear motors being operable in three-dimensional directions including two horizontal directions perpendicular to each other and a vertical direction,
   vibration sensors connected to said apparatus table, and
   control means for deriving displacement and velocity signals from detection results received from said vibration sensors, and calculating control signals from the displacement and velocity signals for application to said linear motors.

2. A damping support structure as claimed in claim 1, wherein each of said linear motors includes a rod connected to a piano wire, said stationary member and said apparatus table being operatively interconnected through the linear motors and piano wires.

3. A damping support structure as claimed in claim 2, wherein said rod of each linear motor is displaceable as supported and guided by a plate spring.

4. A damping support structure as claimed in claim 2 or 3, further comprising a plurality of support members arranged between said support deck and said apparatus table, said air springs being interposed between said support deck and said support members, between said support members and between said support members and said apparatus table, and a lock mechanism for switching at least one of said air springs between an operable state and an inoperable state.

5. A damping support structure as claimed in claim 4, wherein said support members comprise air tanks communicating with said air springs through orifices, respectively.

* * * * *